United States Patent
Seo et al.

(10) Patent No.: US 9,847,250 B2
(45) Date of Patent: Dec. 19, 2017

(54) FLEXIBLE DISPLAY AND METHOD OF MANUFACTURING THE SAME

(71) Applicant: Samsung Display Co., Ltd., Yongin-si, Gyeonggi-do (KR)

(72) Inventors: Tae An Seo, Hwaseong-si (KR); Tae Woong Kim, Yongin-si (KR); Seong Min Wang, Yongin-si (KR); Jin Hwan Choi, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/961,528

(22) Filed: Dec. 7, 2015

(65) Prior Publication Data
US 2016/0211210 A1 Jul. 21, 2016

(30) Foreign Application Priority Data
Jan. 16, 2015 (KR) .................. 10-2015-0008167

(51) Int. Cl.
*H01L 21/76* (2006.01)
*H01L 21/768* (2006.01)
*H01L 23/498* (2006.01)
*G02F 1/1345* (2006.01)
*H01L 23/532* (2006.01)

(52) U.S. Cl.
CPC .... *H01L 21/76838* (2013.01); *G02F 1/13452* (2013.01); *H01L 23/4985* (2013.01); *H01L 23/49866* (2013.01); *H01L 23/53214* (2013.01); *H01L 23/53228* (2013.01); *H01L 23/53242* (2013.01); *H01L 23/53276* (2013.01); *H01L 2924/0002* (2013.01)

(58) Field of Classification Search
CPC ........... H01L 21/76838; H01L 23/4985; H01L 23/49866; H01L 23/53214; H01L 23/53228; H01L 23/53242; H01L 23/53276; H01L 2924/0002; G02F 1/13452

See application file for complete search history.

(56) References Cited

U.S. PATENT DOCUMENTS

| | | | | |
|---|---|---|---|---|
| 9,082,667 B2* | 7/2015 | Youn | ..................... | H01L 27/124 |
| 9,490,215 B2* | 11/2016 | Yang | ..................... | B32B 37/144 |
| 2015/0060931 A1* | 3/2015 | Jung | ..................... | H01L 27/15 |
| | | | | 257/99 |

(Continued)

FOREIGN PATENT DOCUMENTS

| | | |
|---|---|---|
| JP | 9-258893 A | 10/1997 |
| JP | 2000-68614 A | 3/2000 |

(Continued)

*Primary Examiner* — Scott B Geyer
(74) *Attorney, Agent, or Firm* — Knobbe, Martens, Olson & Bear, LLP

(57) ABSTRACT

A flexible display and method of manufacturing the same are disclosed. In one aspect, the display includes a flexible substrate having a bending area and a non-bending area and a plurality of metal wirings formed over the flexible substrate in the bending area and the non-bending area. Each of the metal wirings which are formed in the bending area includes a pair of first hard wirings formed over the flexible substrate and a first soft wiring electrically connected to ends of the pair of first hard wirings.

15 Claims, 12 Drawing Sheets

(56) References Cited

U.S. PATENT DOCUMENTS

| | | | |
|---|---|---|---|
| 2015/0076683 A1* | 3/2015 | Lim | H01L 23/3135 257/704 |
| 2016/0079336 A1* | 3/2016 | Youn | H01L 23/4985 257/40 |
| 2016/0233148 A1* | 8/2016 | Lu | H01L 23/4985 |

FOREIGN PATENT DOCUMENTS

| | | | |
|---|---|---|---|
| KR | 10-2006-0113260 A | 11/2006 | |
| KR | 10-2014-0099139 A | 8/2014 | |

\* cited by examiner

FLEXIBLE DISPLAY AND METHOD OF MANUFACTURING THE SAME

CROSS-REFERENCE TO RELATED APPLICATION

This application claims priority to and the benefit of Korean Patent Application No. 10-2015-0008167 filed in the Korean Intellectual Property Office on Jan. 16, 2015, the entire contents of which are incorporated herein by reference.

BACKGROUND

Field

The described technology generally relates to a flexible display and a method of manufacturing the same.

Description of the Related Technology

Flexible displays are manufactured on a flexible plastic substrate that can be formed of materials such as low temperature poly silicone (LTPS) and polyimide. A pixel array is formed on the flexible substrate and includes data lines and scan lines which intersect each other, thin film transistors (TFTs), and pixel electrodes. The data lines and scan lines of a standard display are formed of chromium (Cr), molybdenum (Mo), aluminum (Al), titanium (Ti) or an alloy thereof. These materials are hard and therefore when the flexible display is bent, the metal wirings may be disconnected due to breakage.

The above information disclosed in this Background section is only intended to enhance the understanding of the background of the described technology and therefore it may contain information that does not form the prior art that is already known in this country to a person of ordinary skill in the art.

SUMMARY OF CERTAIN INVENTIVE ASPECTS

One inventive aspect is a flexible display and a method of manufacturing the same that can prevent the disconnection of wirings via the use of soft wirings formed of a flexible material which connects the hard metal wirings in a bending area of the flexible display.

Another aspect is a flexible display including: a flexible substrate including a bending area and a non-bending area; and a plurality of metal wirings formed on the flexible substrate and formed to intersect each other, wherein the plurality of metal wirings which are formed in the bending area include first hard wirings contacting the flexible substrate and first soft wirings connected to ends of the first hard wirings.

The first soft wirings can be made of any one of silver nanowire (AgNW), aluminum (Al), silver (Ag), magnesium (Mg), copper (Cu), titanium (Ti), copper (Bronze), and carbon nanotube (CNT) or an alloy material thereof.

The metal wirings can be a plurality of data lines which are connected to a data driver IC to supply a driving voltage to a pixel array of the flexible substrate.

The metal wirings can be a plurality of scan lines which are connected to a gate driver IC to supply scan signals to a pixel array of the flexible substrate.

Ends of the first soft wirings can be connected to the ends of the first hard wirings by a female and male connection.

The flexible display can further include: second hard wirings connected to the ends of the first soft wirings.

Another aspect is a flexible display including: a flexible substrate including a bending area and a non-bending area; and a plurality of metal wirings formed on the flexible substrate and formed to intersect each other, wherein the plurality of metal wirings which are formed in the bending area include first soft wirings contacting the flexible substrate and first hard wirings connected to ends of the first soft wirings.

The flexible display can further include: second soft wirings connected to the ends of the first hard wirings.

The flexible display can further include: second hard wirings connected to the ends of the second soft wirings.

Yet another aspect is a method of manufacturing a flexible display including: preparing a flexible substrate including a bending area and a non-bending area; coating an insulating layer on the flexible substrate; forming metal wirings on the insulating layer; forming bridge wirings on a metal wiring formed in the bending area to connect the metal wirings; and forming a passivation layer on the insulating layer to cover the metal wirings and the bridge wirings.

The bridge wirings can be formed to be connected to the end of the metal wiring by an inkjet method.

The bridge wirings can be formed to be connected to the end of the metal wiring by a laser transfer method.

The bridge wirings can be formed to be connected to the end of the metal wiring by a gravure printing method.

The bridge wirings can be formed to be connected to the end of the metal wiring by a deposition method.

The method can further include: after the forming of the bridge wirings, forming hard metal wirings which are connected to the ends of the bridge wirings.

Another aspect is a flexible display comprising a flexible substrate having a bending area and a non-bending area; and a plurality of metal wirings formed over the flexible substrate in the bending area and the non-bending area, wherein each of the metal wirings which are formed in the bending area includes: a pair of first hard wirings formed over the flexible substrate and a first soft wiring electrically connected to ends of the pair of first hard wirings.

In exemplary embodiments, the first soft wirings are formed of one or more of the following: silver nanowire (AgNW), aluminum (Al), silver (Ag), magnesium (Mg), copper (Cu), titanium (Ti), bronze, and carbon nanotube (CNT). The flexible display can further comprise a data driver; and a plurality of pixels formed over the flexible substrate, wherein the metal wirings comprise a plurality of data lines which are connected to the data driver, and wherein the data driver is configured to apply a plurality of driving voltages to the pixels via the data lines. The flexible display can further comprise a scan driver; and a plurality of pixels formed over the flexible substrate, wherein the metal wirings comprise a plurality of scan lines which are connected to the gate driver, and wherein the gate driver is configured to apply a plurality of scan signals to the pixels via the scan lines.

In exemplary embodiments, ends of the first soft wiring are respectively electrically connected to the ends of the first hard wirings by a female and male connection. Each of the metal wirings can further comprise a pair of second hard wirings electrically connected to ends of the first soft wirings.

Another aspect is a flexible display comprising a flexible substrate including a bending area and a non-bending area; and a plurality of metal wirings formed over the flexible substrate in the bending area and the non-bending area, wherein each of the metal wirings which are formed in the bending area includes: a first soft wiring formed over the flexible substrate and a pair of first hard wirings electrically connected to ends of the first soft wiring.

In exemplary embodiments, each of the metal wirings further comprises a second soft wiring electrically connected to ends of the first hard wirings. Each of the metal wirings can further comprise a pair of second hard wirings electrically connected to ends of the second soft wiring.

Another aspect is a method of manufacturing a flexible display comprising preparing a flexible substrate including a bending area and a non-bending area; coating an insulating layer over the flexible substrate; forming a plurality of metal wirings over the insulating layer in the bending area and the non-bending area; forming a plurality of bridge wirings so as to respectively electrically connect pairs of the metal wirings formed in the bending area; and forming a passivation layer over the insulating layer so as to cover the metal wirings and the bridge wirings.

In exemplary embodiments, the bridge wirings are formed so as to be electrically connected to ends of the metal wirings via an inkjet method. The bridge wirings can be formed so as to be electrically connected to ends of the metal wirings via a laser transfer method. The bridge wirings can be formed so as to be electrically connected to ends of the metal wirings via a gravure printing method. The bridge wirings can be formed so as to be electrically connected to ends of the metal wirings via a deposition method. The method can further comprise forming a plurality of hard metal wirings so as to be electrically connected to ends of the bridge wirings after the forming of the bridge wirings.

According to at least one exemplary embodiment, it is possible to prevent the disconnection of the wirings by using the soft wiring formed of a flexible material which connects the hard metal wirings in the bending area of the flexible display. Therefore, it is possible to manufacture a display by enabling the reliable bending of the display.

Further, it is possible to minimize the modification to standard manufacturing processes by using the flexible metal wiring only in the area where bending is possible.

Further, it is possible to save the manufacturing costs and improve the supply network management (SNM) by effectively using an expensive soft wiring (e.g., silver nanowire (AgNW)).

DETAILED DESCRIPTION OF CERTAIN INVENTIVE EMBODIMENTS

Figure 1:
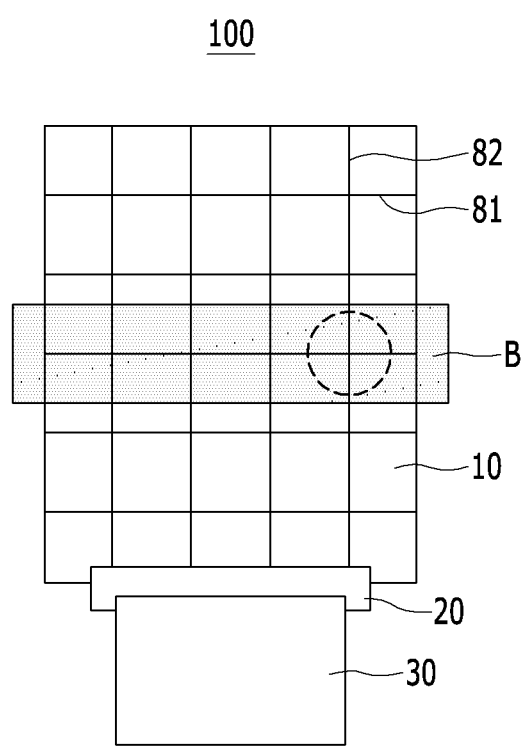
FIG. 1 is a plan view schematically illustrating a flexible display according to an exemplary embodiment.

Hereinafter, the described technology will be described more fully hereinafter with reference to the accompanying drawings, in which exemplary embodiments are shown. As those skilled in the art would realize, the described embodiments may be modified in various different ways, all without departing from the spirit or scope of the described technology.

Further, in exemplary embodiments, since like reference numerals designate like elements having the same or a similar configuration, an exemplary embodiment is representatively described, and in other exemplary embodiments, only those configurations differing from the previously described exemplary embodiment will be described.

It is to be noted that the accompanying drawings is schematically illustrated and may not be illustrated to a scale. The relative dimensions and ratios of components illustrated may be exaggerated or reduced in the drawings for the sake of clarity and convenience in the drawings and any dimensions are only exemplary and therefore the described technology is not limited thereto. Further, the same structures, elements, or parts which are illustrated in at least two drawings are denoted by the same reference numerals, which are used to indicate similar features. When any first portion is described as being "over" or "on" another second portion, this means that the first portion may be directly formed on the second portion or a third portion may be interposed between the first portion and the second portion.

An exemplary embodiment will be described in detail. As a result, numerous variations of exemplary embodiments are expected. Therefore, the exemplary embodiments are not limited to the specific form of the illustrated region(s) and, for example, also include form(s) that may be produced by manufacturing.

Hereinafter, a flexible display according to an exemplary embodiment will be described with reference to FIGS. 1 to 3.

FIG. 1 is a plan view schematically illustrating a flexible display according to an exemplary embodiment. FIG. 2 is an enlarged plan view schematically illustrating the area of the circular dotted line of the bending area B of FIG. 1. FIG. 3 is a cross-sectional view schematically illustrating a section of a metal wire taken along the line II-II of FIG. 2.

Figure 2:
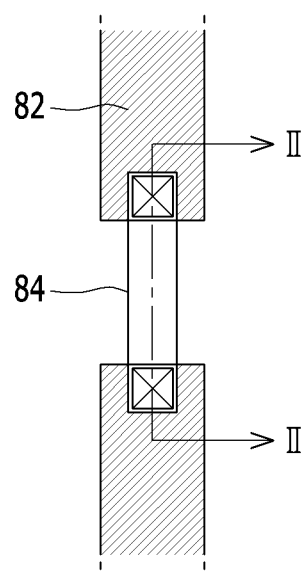
FIG. 2 is an enlarged plan view schematically illustrating the area of the circular dotted line of the bending area B of FIG. 1.
Figure 3:
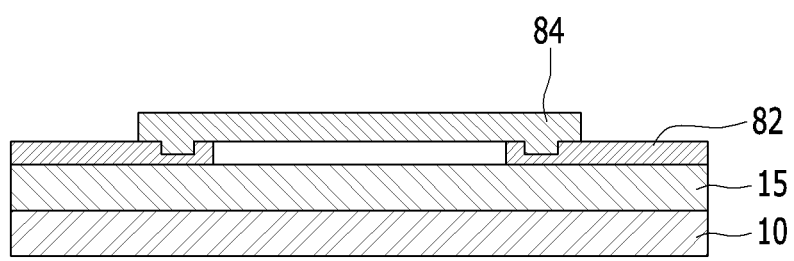
FIG. 3 is a cross-sectional view schematically illustrating a section of a metal wire taken along the line II-II of FIG. 2.

Referring to FIGS. 1 to 3, the flexible display 100 includes a flexible substrate 10 and a plurality of metal wirings or lines 81 and 82 which are formed on the flexible substrate 10 and are formed to intersect each other. These metal wirings 81 and 82 include a plurality of data lines 82 which are connected a data driver integrated circuit (IC) or data driver (not illustrated) to supply driving voltages to a pixel array of the flexible substrate 10 and a plurality of scan lines 81 which are connected to a gate driver IC or scan driver to supply scan signals to the pixel array of the flexible substrate 10.

Additionally, a printed circuit board (PCB) 30 having a driving circuit unit other than the driver IC is connected to the flexible substrate 10 by using a flexible printed circuit (FPC) 20.

FIG. 1 illustrates an example in which the bending area B is formed to be bent in a vertical direction of the flexible substrate 10 and FIG. 2 illustrates an example of a connection structure of a data wire of the bending region B of FIG. 1.

Referring to FIG. 2, each of the metal wirings 81 and 82 which are arranged in the bending region B includes the first hard wirings 82 contacting the flexible substrate 10 and first soft wirings 84 connected to ends of the first hard wirings 82 so as to be connected to the first hard wirings 82. As illustrated in FIG. 3, the ends of the first hard wirings 82 and the ends of the first soft wirings 84 are connected to each other by a female and male connection, that is, are connected to each other by connected a protrusion formed at an end with a recess portion.

The insulating layer 15 formed of an organic layer or an inorganic layer is formed on the flexible substrate 10 and the first hard wirings 82 are formed on the insulating layer 15. The first hard wiring 82 can be formed of chromium (Cr), molybdenum (Mo), aluminum (Al), titanium (Ti), or an alloy thereof. The first soft wiring 84 is connected to the ends of the first hard wirings 82 so as to form a bridge. The first soft wirings 84 can be formed of any one of silver nanowire (AgNW), aluminum (Al), silver (Ag), magnesium (Mg), copper (Cu), titanium (Ti), copper (Bronze), and carbon nanotube (CNT) or an alloy material thereof.

When the flexible substrate 10 is bent, the first soft wiring 84 can be bent up and/or down based on the orientation of the drawings due to the connection structure of the first soft wiring 84 of FIG. 3. Therefore, as compared when only the hard wirings are included, defects that may occur due to a disconnection can be prevented.

Figure 4:
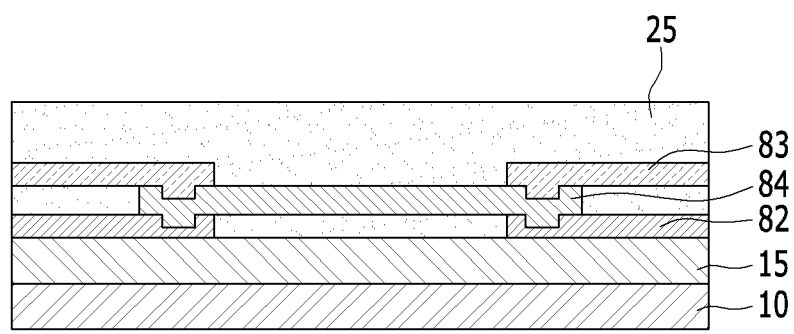
FIG. 4 is a cross-sectional view schematically illustrating a section of a metal wiring of a flexible display according to another exemplary embodiment.

FIG. 4 is a cross-sectional view schematically illustrating a section of a metal wiring of a flexible display according to another exemplary embodiment. As shown in FIG. 4, the flexible display further includes the second hard wirings 83 which are connected to the ends of the first soft wirings 84 so as to be connected to the first soft wirings 84. That is, the ends of the first soft wirings 84 are connected to the second hard wirings 83 by the female and male connection so as to be connected to the first soft wirings 84.

Figure 5:
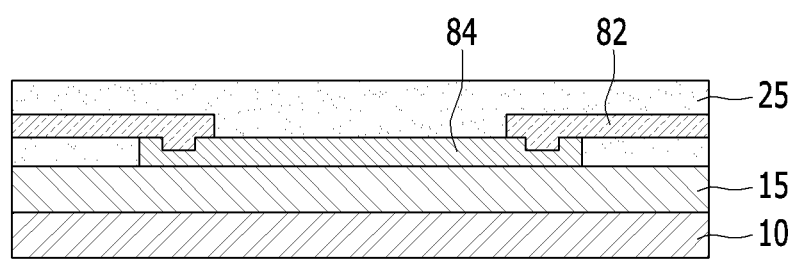
FIG. 5 is a cross-sectional view schematically illustrating a section of a metal wiring of a flexible display according to still another exemplary embodiment.

FIG. 5 is a cross-sectional view schematically illustrating a section of a metal wiring of a flexible display according to still another exemplary embodiment. Referring to FIG. 5, the flexible display 100 includes the flexible substrate 10 including the bending area B and the non-bending area and the metal wirings 81 and 82 which are formed on the flexible substrate 10 and are formed to intersect each other.

The metal wirings 81 and 82 which are formed in the bending region B includes the first soft wirings 84 contacting the flexible substrate 10 and the first hard wirings 82 connected to ends of the first soft wirings 84 so as to be connected to the first soft wirings 84.

In contrast to the exemplary embodiment of FIG. 3, the exemplary embodiment illustrated in FIG. 5 includes the first soft wirings 84 that contact the flexible substrate 10 and the first soft wirings 84 are connected to the first hard wirings 82.

Figure 6:
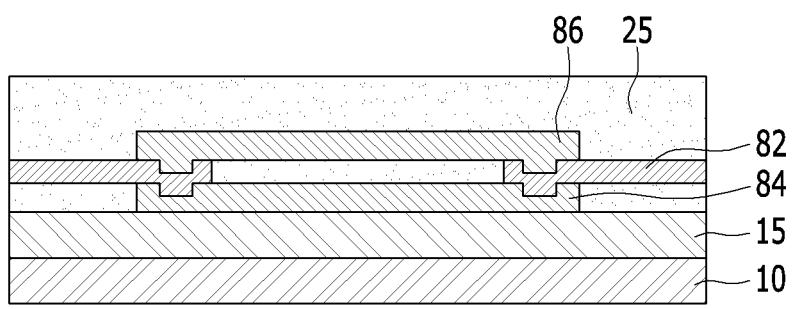
FIG. 6 is a cross-sectional view schematically illustrating the section of the metal wiring of the flexible display according to still another exemplary embodiment.
Figure 7:
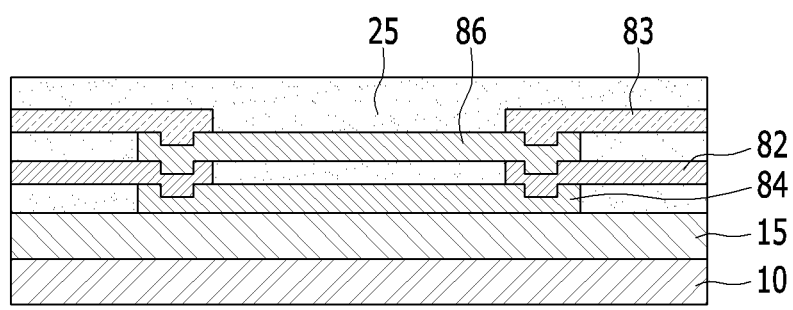
FIG. 7 is a cross-sectional view schematically illustrating the section of the metal wiring of the flexible display according to still another exemplary embodiment.

FIG. 6 is a cross-sectional view schematically illustrating the section of the metal wiring of the flexible display according to still another exemplary embodiment. FIG. 7 is a cross-sectional view schematically illustrating the section of the metal wiring of the flexible display according to still another exemplary embodiment.

Referring to FIG. 6, in contrast to the exemplary embodiment of FIG. 5, the second soft wirings 86 are further formed on the first hard wirings 82 and are connected to the ends of the first hard wirings 82 so as to be connected to the first hard wirings 82. Further, referring to FIG. 7, in contrast to the exemplary embodiment of FIG. 6, the second hard wirings 83 are further formed on the second soft wirings 86 and are connected to the ends of the second soft wirings 86 so as to be connected to second soft wirings 86.

In addition to the structure in which two soft wirings 84 and 86 and two hard wirings 82 and 83 which are illustrated in FIG. 7 are each stacked, the number of soft wirings and hard wirings can be variously changed depending on the purpose of the implementation.

Figure 8:
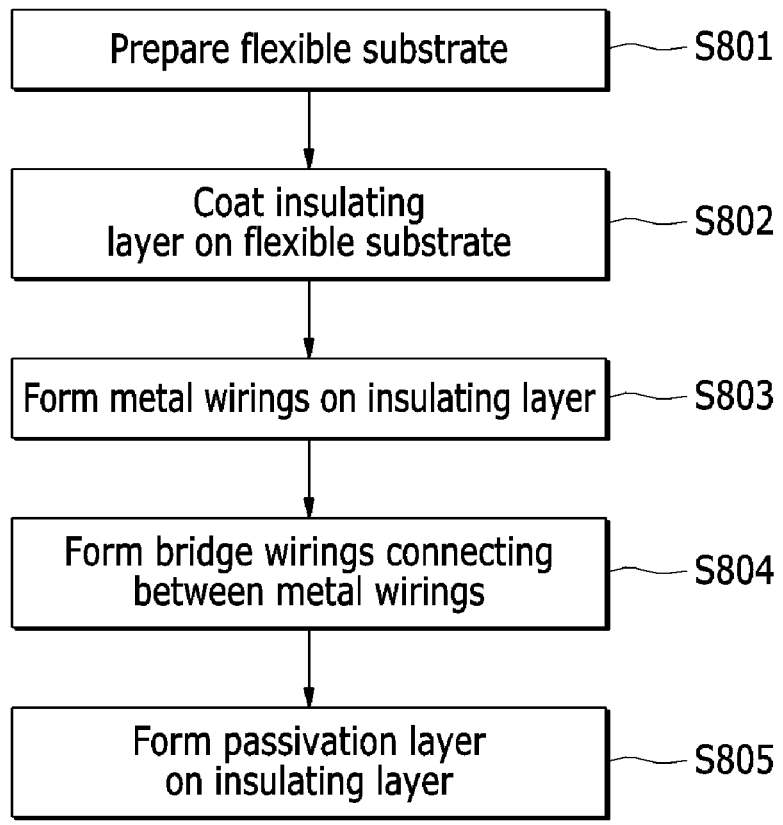
FIG. 8 is a flow chart illustrating a method for manufacturing a flexible display according to an exemplary embodiment.

FIG. 8 is a flow chart illustrating a method for manufacturing a flexible display according to an exemplary embodiment. Depending on embodiments, additional states may be added, others removed, or the order of the states changed in the procedure of FIG. 8.

Referring to FIG. 8, first, the flexible substrate 10 including the bending area B and the non-bending area is prepared (S801) and the insulating layer 15 formed of the organic layer or the inorganic layer is coated on the flexible substrate 10 (S802).

Next, the metal wirings 82 and 84 are formed on the insulating layer 15 (S803). The metal wirings can be the hard wiring 82 which can be formed of chromium (Cr), molybdenum (Mo), aluminum (Al), titanium (Ti), or an alloy thereof as described above. Further, the metal wirings can be the soft wiring 84 which can be formed of any one of silver nanowire (AgNW), aluminum (Al), silver (Ag), magnesium (Mg), copper (Cu), titanium (Ti), copper (Bronze), and carbon nanotube (CNT) or an alloy material thereof.

Next, the bridge wirings are formed on the metal wiring which is formed in the bending area B to connect the metal wirings (S804). When the metal wirings are the hard wiring 82, the bridge wirings are the soft wiring 84 and when the metal wirings are the soft wiring 84, the bridge wirings are the hard wiring 82. The stacked structure of the hard wiring and the soft wiring can be variously formed similar to the structures described with reference to FIGS. 3 to 7.

Next, a passivation layer is formed on the insulating layer 15 to cover the metal wirings and the bridge wirings (S805). The passivation layer 25 is a protective layer to protect the metal wirings and the bridge wirings from the environment and can be formed of a single layer which is formed of one or more material such as a silicone oxide layer and a silicone nitride layer or a multilayer thereof but is not limited thereto, and therefore the passivation layer 25 can be formed of various materials.

Figure 9:
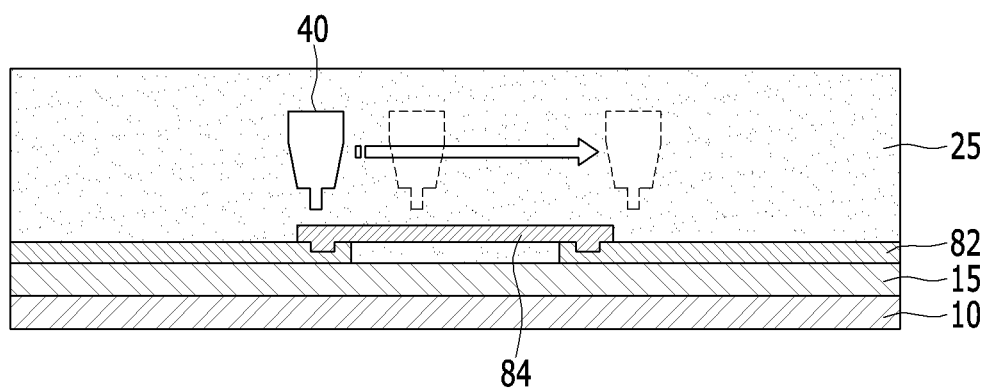
FIG. 9 is a diagram illustrating an example in which a bridge wiring of the flexible display according to the exemplary embodiment is formed.

Further, as illustrated in FIG. 9, the bridge wirings can be formed by an inkjet method. The inkjet method is a non-contact type pattern forming method which injects a solution, which is prepared in an ink form, in several to tens of picoliters per drop through a micro nozzle to form a pattern. The inkjet can include a housing 40 filled with the material of the bridge wiring and an injection nozzle formed in the housing and can discharge the bridge wiring material through the fine nozzle to form the pattern so as to connect the bridge wiring to the end of the metal wiring. In particular, according to the standard method, after the pattern is formed, the amount of the silver nanowire (AgNW) that is lost is about 90% or more. The inkjet printing method is advantageous in saving the amount of material lost, particularly because AgNM is an expensive material.

Figure 10:
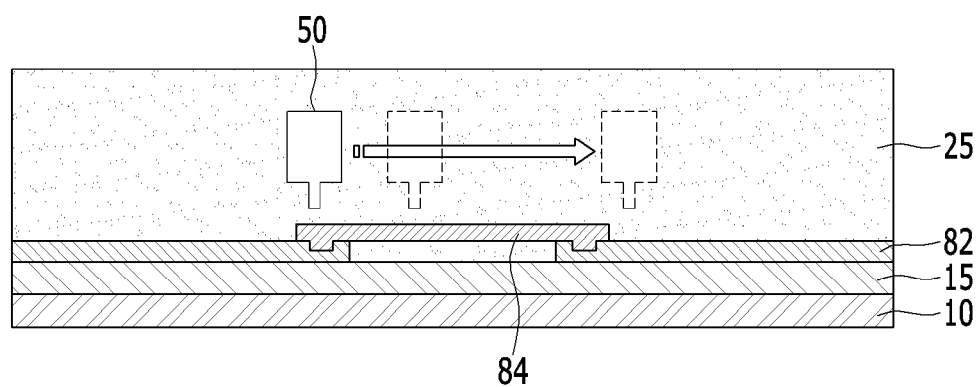
FIG. 10 is a diagram illustrating another example in which the bridge wiring of the flexible display according to the exemplary embodiment is formed.

Further, as illustrated in FIG. 10, the bridge wirings can be formed to be connected to the ends of the metal wirings using a laser transfer method. The laser transfer method is a method of transferring a material coated on a donor film to a substrate while laser light is focused on a light-to-heat conversion layer. A laser beam is applied from a laser supply source 50 to transfer a material having a sheet, powder, or film form so as to form the bridge wirings between the metal wirings, thereby forming the pattern.

Figure 11:
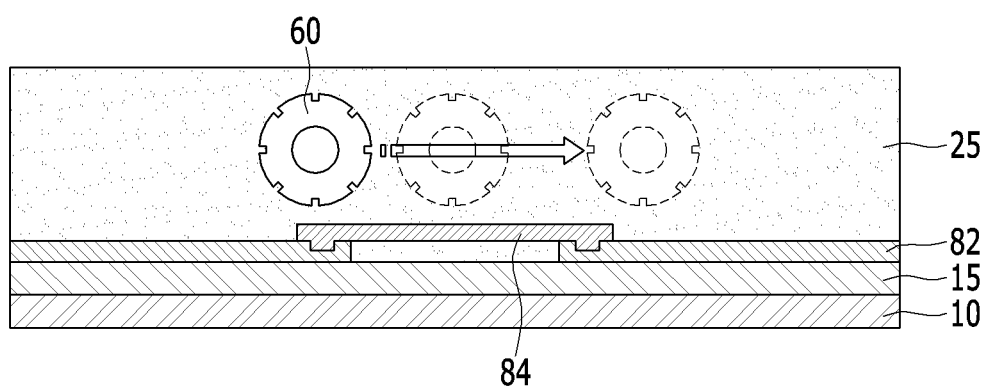
FIG. 11 is a diagram illustrating still another example in which the bridge wiring of the flexible display according to the exemplary embodiment is formed.

Further, as illustrated in FIG. 11, the bridge wirings can be formed by pattering a liquid type bridge wiring material by a gravure printing method. The gravure printing is a type of intaglio printing and is a method of covering a cylindrical plate 60, which is formed with protrusions and depressions, with ink, removing the ink covering the convex portion, and then transferring the ink remaining in the concave portions to print the wirings.

Figure 12:
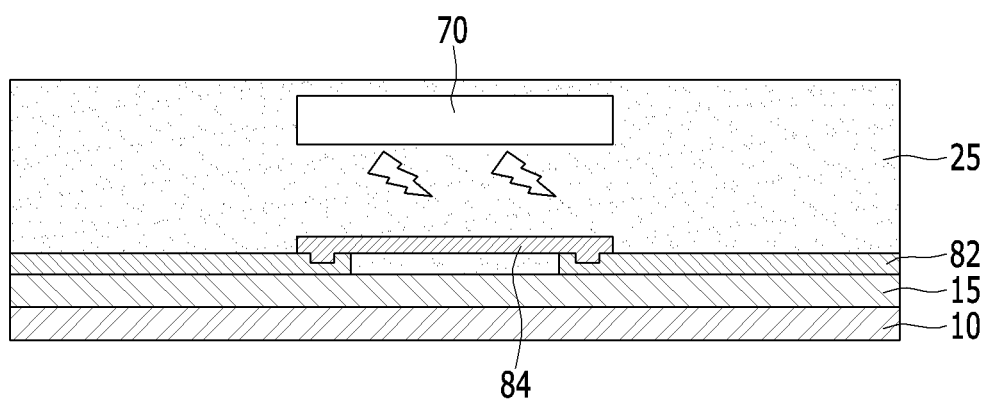
FIG. 12 is a diagram illustrating still another example in which the bridge wiring of the flexible display according to the exemplary embodiment is formed.

Further, as illustrated in FIG. 12, the bridge wirings can be formed to be connected to the ends of the metal wirings by depositing a material contained in a deposition source 70 using a sputtering method or a chemical vapor deposition method.

Additionally, the method can further include forming hard metal wirings which are connected to the ends of the bridge wirings so as to be connected to the bridge wirings after the forming of the bridge wirings. The method of manufacturing a flexible display according to the exemplary embodiment can be variously altered, corresponding to the structures described above with reference to FIGS. 3 to 7

As described above, the flexible display and the method of manufacturing the same in accordance with at least one exemplary embodiment, it is possible to prevent the disconnection of the wirings by using the soft wiring formed of a flexible material to electrically connect the existing hard metal wirings in the bending area of the flexible display. Therefore, it is possible to manufacture a flexible display that can be repeatedly bent.

Further, it is possible to minimize the modification from existing processes by using the flexible metal wiring only in the bending area.

Further, it is possible to save the manufacturing costs and improve the supply network management (SNM) by effectively using an expensive soft wiring (e.g., silver nanowire (AgNW)).

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A flexible display, comprising:
  a flexible substrate having a bending area and a non-bending area; and
  a plurality of metal wirings formed over the flexible substrate in the bending area and the non-bending area,
  wherein each of the metal wirings which are formed in the bending area includes: a pair of first inflexible wirings formed over the flexible substrate and a first flexible wiring electrically connected to ends of the pair of first inflexible wirings.

2. The flexible display of claim 1, wherein the first flexible wirings are formed of one or more of the following: silver nanowire (AgNW), aluminum (Al), silver (Ag), magnesium (Mg), copper (Cu), titanium (Ti), bronze, and carbon nanotube (CNT).

3. The flexible display of claim 1, further comprising:
  a data driver; and
  a plurality of pixels formed over the flexible substrate,
  wherein the metal wirings comprise a plurality of data lines which are connected to the data driver, and
  wherein the data driver is configured to apply a plurality of driving voltages to the pixels via the data lines.

4. The flexible display of claim 1, further comprising:
  a scan driver; and
  a plurality of pixels formed over the flexible substrate,
  wherein the metal wirings comprise a plurality of scan lines which are connected to the gate driver, and
  wherein the gate driver is configured to apply a plurality of scan signals to the pixels via the scan lines.

5. The flexible display of claim 1, wherein ends of the first flexible wiring are respectively electrically connected to the ends of the first inflexible wirings by a female and male connection.

6. The flexible display of claim 1, wherein each of the metal wirings further comprises a pair of second inflexible wirings electrically connected to ends of the first flexible wirings.

7. A flexible display, comprising:
  a flexible substrate including a bending area and a non-bending area; and
  a plurality of metal wirings formed over the flexible substrate in the bending area and the non-bending area,
  wherein each of the metal wirings which are formed in the bending area includes: a first flexible wiring formed over the flexible substrate and a pair of first inflexible and wirings electrically connected to ends of the first flexible wiring.

8. The flexible display of claim 7, wherein each of the metal wirings further comprises a second flexible wiring electrically connected to ends of the first inflexible wirings.

9. The flexible display of claim 8, wherein each of the metal wirings further comprises a pair of second inflexible wirings electrically connected to ends of the second flexible wiring.

10. A method of manufacturing a flexible display, comprising:
  preparing a flexible substrate including a bending area and a non-bending area;
  coating an insulating layer over the flexible substrate;
  forming a plurality of metal wirings over the insulating layer in the bending area and the non-bending area;
  forming a plurality of bridge wirings so as to respectively electrically connect pairs of the metal wirings formed in the bending area; and
  forming a passivation layer over the insulating layer so as to cover the metal wirings and the bridge wirings.

11. The method of claim 10, wherein the bridge wirings are formed so as to be electrically connected to ends of the metal wirings via an inkjet method.

12. The method of claim 10, wherein the bridge wirings are formed so as to be electrically connected to ends of the metal wirings via a laser transfer method.

13. The method of claim 10, wherein the bridge wirings are formed so as to be electrically connected to ends of the metal wirings via a gravure printing method.

14. The method of claim 10, wherein the bridge wirings are formed so as to be electrically connected to ends of the metal wirings via a deposition method.

15. The method of claim 10, further comprising forming a plurality of inflexible metal wirings so as to be electrically connected to ends of the bridge wirings after the forming of the bridge wirings.

* * * * *